US012647133B2

(12) United States Patent
Coquerel et al.

(10) Patent No.: US 12,647,133 B2
(45) Date of Patent: Jun. 2, 2026

(54) UNIVERSAL DECOMPRESSION FOR ACCELERATOR DEVICES

(71) Applicant: INTEL CORPORATION, Santa Clara, CA (US)

(72) Inventors: Laurent Coquerel, Limerick (IE); Fei Wang, Clare (IE); John Browne, Limerick (IE); Smita Kumar, Chandler, AZ (US); Declan Doherty, Clondalkin (IE); Marlow Weston, Austin, TX (US); Reshma Pattan, Tuam (IE)

(73) Assignee: INTEL CORPORATION, Santa Clara, CA (US)

( * ) Notice: Subject to any disclaimer, the term of this patent is extended or adjusted under 35 U.S.C. 154(b) by 75 days.

(21) Appl. No.: 17/870,659

(22) Filed: Jul. 21, 2022

(65) Prior Publication Data

US 2022/0368348 A1     Nov. 17, 2022

(51) Int. Cl.
*H03M 7/30*        (2006.01)

(52) U.S. Cl.
CPC ......... *H03M 7/707* (2013.01); *H03M 7/6088* (2013.01)

(58) Field of Classification Search
CPC ........................... H03M 7/6088; H03M 7/707
See application file for complete search history.

(56) References Cited

U.S. PATENT DOCUMENTS

| | | | |
|---|---|---|---|
| 9,466,258 B2 | 10/2016 | Ju et al. | |
| 9,521,218 B1 | 12/2016 | Fan et al. | |
| 9,807,189 B2 | 10/2017 | Ichien | |
| 2005/0104753 A1* | 5/2005 | Dror ................... | H03M 7/3086 |
| | | | 341/51 |
| 2005/0278502 A1* | 12/2005 | Hundley ............... | G06F 9/4843 |
| | | | 712/34 |
| 2009/0168777 A1* | 7/2009 | Chuang ............... | H04L 12/4641 |
| | | | 370/390 |
| 2012/0045139 A1* | 2/2012 | Demidov ............... | H04N 19/70 |
| | | | 382/233 |
| 2020/0229206 A1* | 7/2020 | Badic ................ | H04W 28/0226 |
| 2022/0368348 A1* | 11/2022 | Coquerel ........... | H03M 7/6088 |

* cited by examiner

*Primary Examiner* — Etienne P Leroux
(74) *Attorney, Agent, or Firm* — KDW FIRM PLLC

(57) ABSTRACT

An accelerator device determines a compression format based on a header of a structured data element to be decompressed. The accelerator device may configure the accelerator device based on the compression format. The accelerator device may decompress a data block of the structured data element based on the configuration.

25 Claims, 8 Drawing Sheets

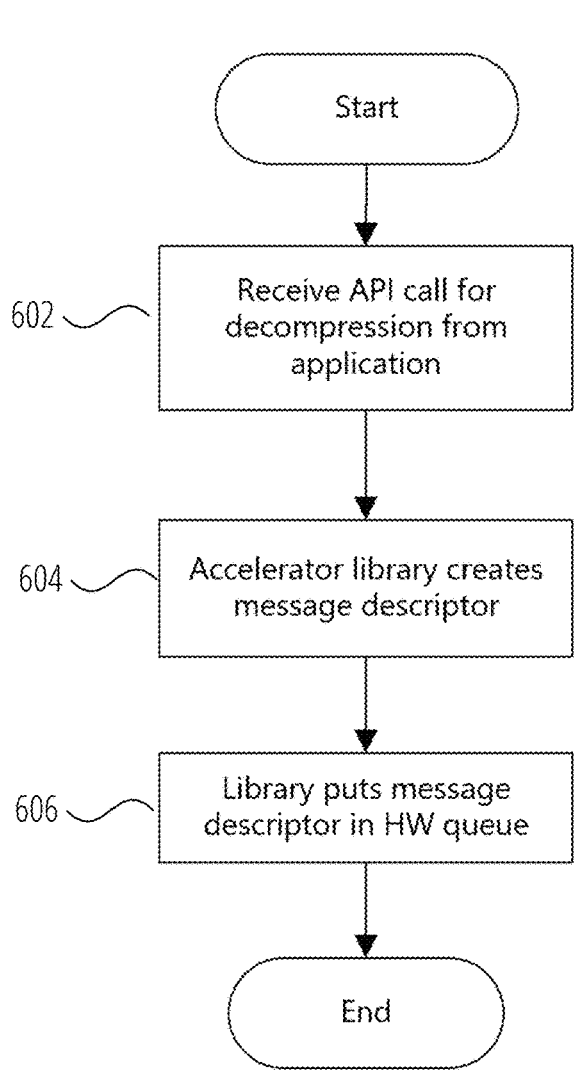
FIG. 6

700

DETERMINE, BY AN ACCELERATOR DEVICE, A COMPRESSION FORMAT BASED ON A HEADER OF A STRUCTURED DATA ELEMENT TO BE DECOMPRESSED 702

DETERMINE WHETHER THE COMPRESSION FORMAT IS SUPPORTED BY THE ACCELERATOR DEVICE 704

RETURN AN ERROR BASED ON A DETERMINATION THE COMPRESSION FORMAT IS NOT SUPPORTED BY THE ACCELERATOR DEVICE 706

CONFIGURE, BY THE ACCELERATOR DEVICE BASED ON A DETERMINATION THAT THE COMPRESSION FORMAT IS SUPPORTED BY THE ACCELERATOR DEVICE, THE ACCELERATOR DEVICE BASED ON THE COMPRESSION FORMAT 708

DECOMPRESS, BY THE ACCELERATOR DEVICE BASED ON THE CONFIGURATION, A DATA BLOCK OF THE STRUCTURED DATA ELEMENT 710

FIG. 7

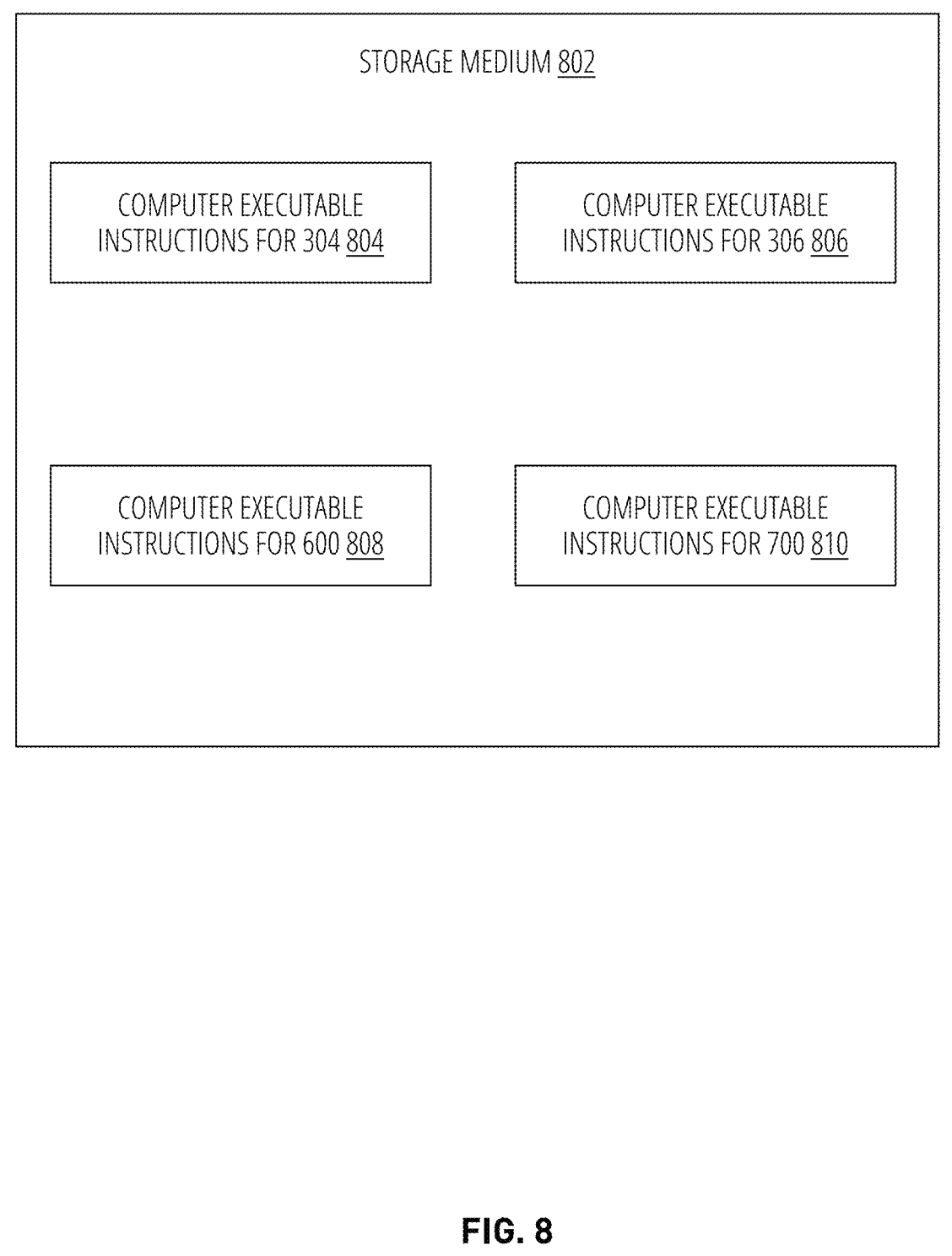

STORAGE MEDIUM 802

COMPUTER EXECUTABLE
INSTRUCTIONS FOR 304 804

COMPUTER EXECUTABLE
INSTRUCTIONS FOR 306 806

COMPUTER EXECUTABLE
INSTRUCTIONS FOR 600 808

COMPUTER EXECUTABLE
INSTRUCTIONS FOR 700 810

FIG. 8

UNIVERSAL DECOMPRESSION FOR ACCELERATOR DEVICES

BACKGROUND

There are numerous compression algorithms to compress and/or decompress data. Conventionally, to have data decompressed by an accelerator device, software applications must parse a data frame to identify the algorithm used to compress the data frame. The application must then provide information determined by parsing the frame to the accelerator to configure the hardware accelerator. The hardware accelerator would receive data blocks within each frame, rather than the entire frame itself, and decompress the received data blocks. Allowing software to parse the frame and configure the accelerator results in added latency and overhead, thereby degrading system performance. Furthermore, exposing the accelerator device to configuration by software poses security risks.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 6 illustrates a logic flow 600 in accordance with one embodiment.

FIG. 7 illustrates a logic flow 700 in accordance with one embodiment.

FIG. 8 illustrates a storage medium in accordance with one embodiment.

DETAILED DESCRIPTION

Figure 1:
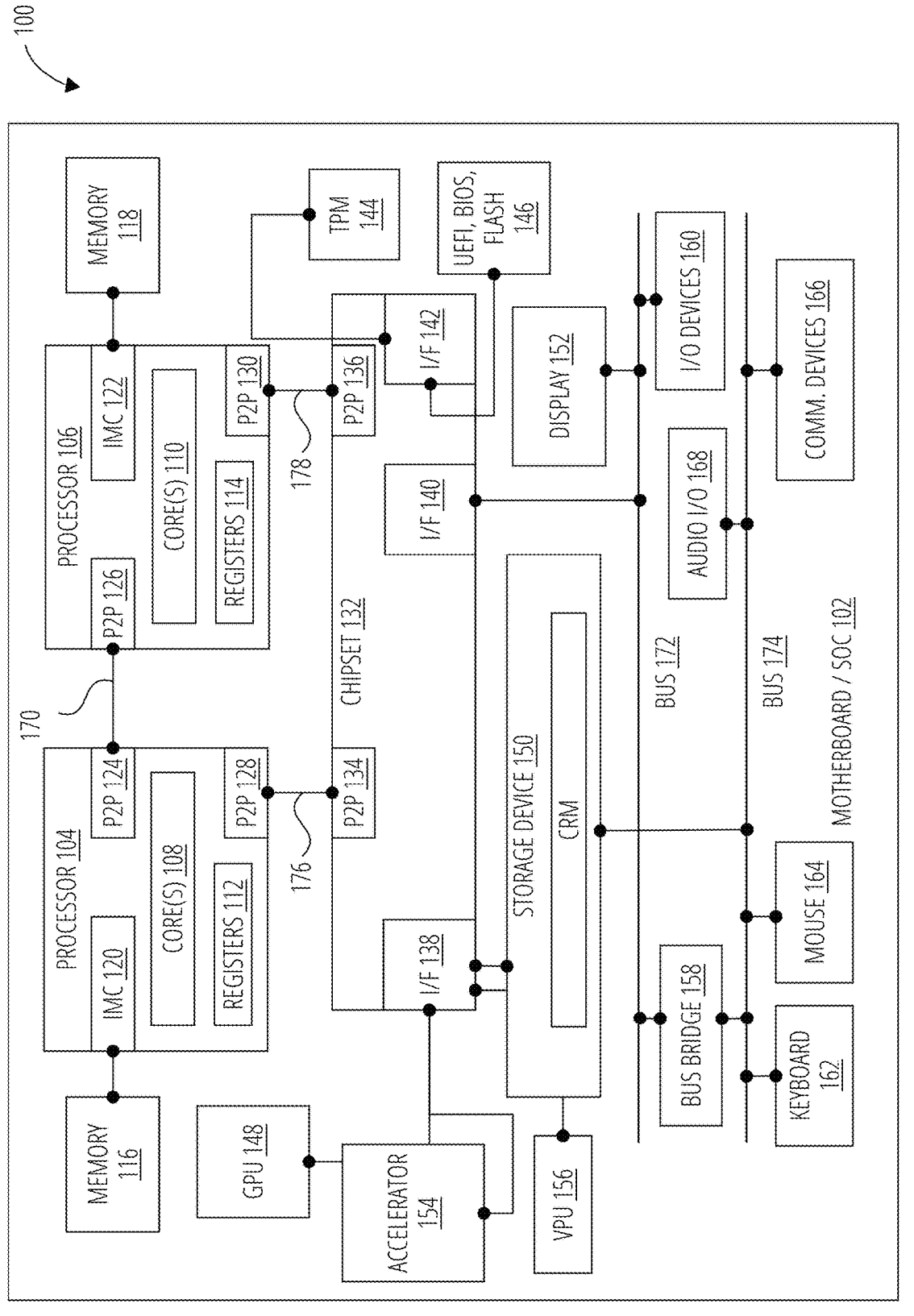
FIG. 1 illustrates an aspect of a system in accordance with one embodiment.

Embodiments disclosed herein relate to accelerator devices that provide universal decompression based on any number of compression algorithms. Generally, an accelerator device may consume entire data frames, rather than being limited to consuming only the compressed data therein. By consuming the entire data frame, the accelerator device may identify the compression format of the compressed data and the compression format specific configurations within a given data frame. The accelerator device may then configure itself based on the configuration from the data frame to process the compressed data without any intervention from software that submitted the data frame for decompression.

For example, a data frame received by an accelerator device from an application may include a header. The accelerator device may identify, in the header, an identifier that uniquely identifies a compression format of compressed data in the data frame. The accelerator device may determine whether the identifier is valid (e.g., whether the accelerator device supports the corresponding compression format). If the identifier is valid, the accelerator device may decode the remainder of the header to extract the parameters required to configure the hardware decompression accelerators of the accelerator device to decompress the compressed data. If, however, the identifier is not valid, the accelerator device may not support the corresponding compression format, and the accelerator device may return an error to the application.

Advantageously, embodiments disclosed herein provide accelerator devices that do not need to be configured by software to decompress data. Conventionally, software needed to parse data frames to identify the information required to decompress the data and pass this information to the accelerator device. Instead, the accelerator devices disclosed herein may decode all the necessary information from the data frame. Doing so results in significant latency reductions as the software no longer needs to parse each data frame. Furthermore, by removing the ability of an application (or a device driver) to configure the hardware accelerator, security is improved, as malicious entities may use the application and/or device driver to gain malicious access to the accelerator device (e.g., creating a denial of service attack and/or maliciously accessing data). Furthermore, embodiments disclosed herein require fewer steps to configure accelerator devices. Doing so allows applications to blindly submit compressed payloads to the accelerator devices, which reduces software complexity. Further still, embodiments disclosed herein are easily adoptable and scalable to all types of present and/or future hardware accelerator devices. By adding support for new algorithms in the accelerator devices, the costs to develop and execute applications and drivers are reduced, as the new algorithms will be transparent to the software stack.

Reference is now made to the drawings, wherein like reference numerals are used to refer to like elements throughout. In the following description, for purposes of explanation, numerous specific details are set forth in order to provide a thorough understanding thereof. However, the novel embodiments can be practiced without these specific details. In other instances, well known structures and devices are shown in block diagram form in order to facilitate a description thereof. The intention is to cover all modifications, equivalents, and alternatives consistent with the claimed subject matter.

In the Figures and the accompanying description, the designations "a" and "b" and "c" (and similar designators) are intended to be variables representing any positive integer. Thus, for example, if an implementation sets a value for a=5, then a complete set of components 122 illustrated as components 122-1 through 122-$a$ may include components 122-1, 122-2, 122-3, 122-4, and 122-5. The embodiments are not limited in this context.

FIG. 1 illustrates an embodiment of a system 100. System 100 is a computer system with multiple processor cores such as a distributed computing system, supercomputer, high-performance computing system, computing cluster, mainframe computer, mini-computer, client-server system, personal computer (PC), workstation, server, portable computer, laptop computer, tablet computer, handheld device such as a personal digital assistant (PDA), or other device for processing, displaying, or transmitting information. Similar embodiments may comprise, e.g., entertainment devices such as a portable music player or a portable video player, a smart phone or other cellular phone, a telephone, a digital video camera, a digital still camera, an external storage device, or the like. Further embodiments implement larger scale server configurations. In other embodiments, the system 100 may have a single processor with one core or more than one processor. Note that the term "processor" refers to a processor with a single core or a processor package with multiple processor cores. More generally, the computing system 100 is configured to implement all logic, systems, logic flows, methods, apparatuses, and functionality described herein with reference to FIGS. 1-8.

As used in this application, the terms "system" and "component" and "module" are intended to refer to a computer-related entity, either hardware, a combination of hardware and software, software, or software in execution, examples of which are provided by the exemplary system 100. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

As shown in FIG. 1, system 100 comprises a motherboard or system-on-chip (SoC) 102 for mounting platform components. Motherboard or system-on-chip (SoC) 102 is a point-to-point (P2P) interconnect platform that includes a first processor 104 and a second processor 106 coupled via a point-to-point interconnect 170 such as an Ultra Path Interconnect (UPI). In other embodiments, the system 100 may be of another bus architecture, such as a multi-drop bus. Furthermore, each of processor 104 and processor 106 may be processor packages with multiple processor cores including core(s) 108 and core(s) 110, respectively. While the system 100 is an example of a two-socket (2S) platform, other embodiments may include more than two sockets or one socket. For example, some embodiments may include a four-socket (4S) platform or an eight-socket (8S) platform. Each socket is a mount for a processor and may have a socket identifier. Note that the term platform refers to the motherboard with certain components mounted such as the processor 104 and chipset 132. Some platforms may include additional components and some platforms may only include sockets to mount the processors and/or the chipset. Furthermore, some platforms may not have sockets (e.g. SoC, or the like). Although depicted as a motherboard or SoC 102, one or more of the components of the motherboard or SoC 102 may also be included in a single die package, a multi-chip module (MCM), a multi-die package, a chiplet, a bridge, and/or an interposer. Therefore, embodiments are not limited to a motherboard or a SoC.

The processor 104 and processor 106 can be any of various commercially available processors, including without limitation an Intel® Celeron®, Core®, Core (2) Duo®, Itanium®, Pentium®, Xeon®, and XScale® processors; AMD® Athlon®, Duron® and Opteron® processors; ARM® application, embedded and secure processors; IBM® and Motorola® DragonBall® and PowerPC® processors; IBM and Sony® Cell processors; and similar processors. Dual microprocessors, multi-core processors, and other multi-processor architectures may also be employed as the processor 104 and/or processor 106. Additionally, the processor 104 need not be identical to processor 106.

Processor 104 includes an integrated memory controller (IMC) 120 and point-to-point (P2P) interface 124 and P2P interface 128. Similarly, the processor 106 includes an IMC 122 as well as P2P interface 126 and P2P interface 130. IMC 120 and IMC 122 couple the processors processor 104 and processor 106, respectively, to respective memories (e.g., memory 116 and memory 118). Memory 116 and memory 118 may be portions of the main memory (e.g., a dynamic random-access memory (DRAM)) for the platform such as double data rate type 3 (DDR3) or type 4 (DDR4) or type 5 (DDR5) synchronous DRAM (SDRAM). In the present embodiment, the memory 116 and the memory 118 locally attach to the respective processors (i.e., processor 104 and processor 106). In other embodiments, the main memory may couple with the processors via a bus and shared memory hub. In some embodiments, the memory 116 and/or memory 118 may be implemented in a tiered memory architecture, a memory pool, and/or a distributed memory. Processor 104 includes registers 112 and processor 106 includes registers 114.

System 100 includes chipset 132 coupled to processor 104 and processor 106. Furthermore, chipset 132 can be coupled to storage device 150, for example, via an interface (I/F) 138. The I/F 138 may be, for example, a Peripheral Component Interconnect-enhanced (PCIe) interface, a Compute Express Link® (CXL) interface, or a Universal Chiplet Interconnect Express (UCIe) interface. Storage device 150 can store instructions executable by circuitry of system 100 (e.g., processor 104, processor 106, GPU 148, accelerator 154, vision processing unit 156, or the like).

Processor 104 couples to the chipset 132 via P2P interface 128 and P2P 134 while processor 106 couples to the chipset 132 via P2P interface 130 and P2P 136. Direct media interface (DMI) 176 and DMI 178 may couple the P2P interface 128 and the P2P 134 and the P2P interface 130 and P2P 136, respectively. DMI 176 and DMI 178 may be a high-speed interconnect that facilitates, e.g., eight Giga Transfers per second (GT/s) such as DMI 3.0. In other embodiments, the processor 104 and processor 106 may interconnect via a bus.

The chipset 132 may comprise a controller hub such as a platform controller hub (PCH). The chipset 132 may include a system clock to perform clocking functions and include interfaces for an I/O bus such as a universal serial bus (USB), peripheral component interconnects (PCIs), CXL interconnects, UCIe interconnects, interface serial peripheral interconnects (SPIs), integrated interconnects (I2Cs), and the like, to facilitate connection of peripheral devices on the platform. In other embodiments, the chipset 132 may comprise more than one controller hub such as a chipset with a memory controller hub, a graphics controller hub, and an input/output (I/O) controller hub.

In the depicted example, chipset 132 couples with a trusted platform module (TPM) 144 and UEFI, BIOS, FLASH circuitry 146 via I/F 142. The TPM 144 is a dedicated microcontroller designed to secure hardware by integrating cryptographic keys into devices. The UEFI, BIOS, FLASH circuitry 146 may provide pre-boot code.

Furthermore, chipset 132 includes the I/F 138 to couple chipset 132 with a high-performance graphics engine, such as, graphics processing circuitry or a graphics processing unit (GPU) 148. In other embodiments, the system 100 may include a flexible display interface (FDI) (not shown) between the processor 104 and/or the processor 106 and the chipset 132. The FDI interconnects a graphics processor core in one or more of processor 104 and/or processor 106 with the chipset 132.

Additionally, accelerator 154 and/or vision processing unit 156 can be coupled to chipset 132 via I/F 138. The accelerator 154 is representative of any type of accelerator device, such as a cryptographic accelerator, cryptographic co-processor, an offload engine, and the like. The accelerator 154 may be a device including circuitry to accelerate data encryption, data compression, and/or data decompression. The accelerator 154 can also include circuitry arranged to execute machine learning (ML) related operations (e.g., training, inference, etc.) for ML models. Generally, the accelerator 154 may be specially designed to perform computationally intensive operations, such as cryptographic operations and/or compression/decompression operations, in a manner that is far more efficient than when performed by the processor 104 or processor 106. Because the load of the system 100 may include cryptographic and/or compression operations, the accelerator 154 can greatly increase performance of the system 100 for these operations.

Various I/O devices 160 and display 152 couple to the bus 172, along with a bus bridge 158 which couples the bus 172 to a second bus 174 and an I/F 140 that connects the bus 172 with the chipset 132. In one embodiment, the second bus 174 may be a low pin count (LPC) bus. Various devices may couple to the second bus 174 including, for example, a keyboard 162, a mouse 164 and communication devices 166.

Furthermore, an audio I/O 168 may couple to second bus 174. Many of the I/O devices 160 and communication devices 166 may reside on the motherboard or system-on-chip (SoC) 102 while the keyboard 162 and the mouse 164 may be add-on peripherals. In other embodiments, some or all the I/O devices 160 and communication devices 166 are add-on peripherals and do not reside on the motherboard or system-on-chip (SoC) 102.

Figure 2:
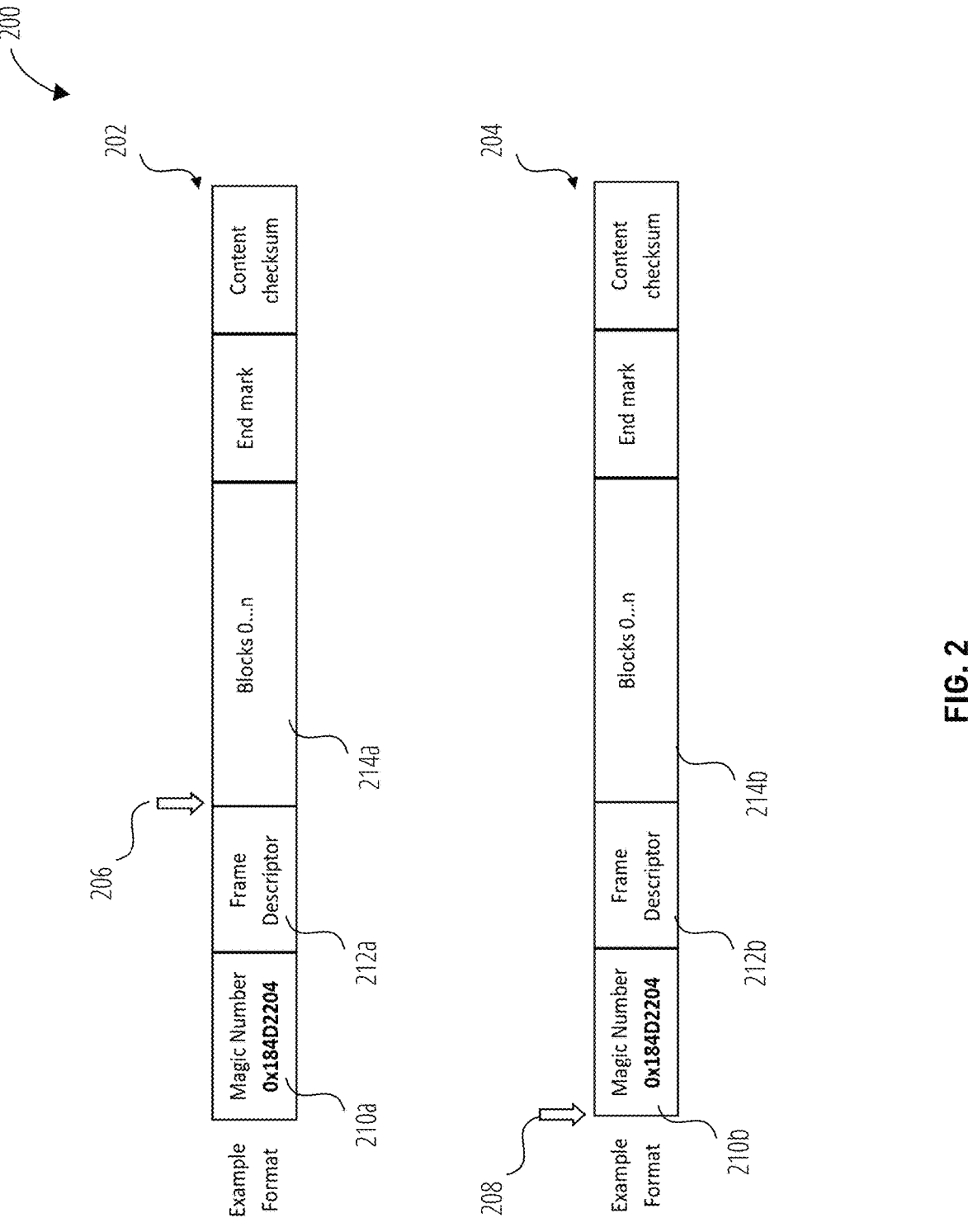
FIG. 2 illustrates an aspect of the subject matter in accordance with one embodiment.

FIG. 2 is a schematic 200 illustrating example data frames, according to various embodiments. As shown, FIG. 2 depicts a data frame 202 and a data frame 204. Data frame 202 includes a magic number 210a, a frame descriptor 212a, one or more data blocks 214a. Similarly, data frame 204 includes magic number 210b, a frame descriptor 212b, and one or more data blocks 214b. The magic numbers 210a and 210b may be part of a header of the respective frames and may be unique identifiers that uniquely identify a compression format. In some embodiments, the magic numbers 210a, 210b, are 2-byte identifiers. Generally, for a plurality of different compression formats, each compression format may be associated with a respective unique identifier (e.g., a unique magic number). The compression formats may include lossless compression formats. Example compression formats include, but are not limited to, the GZip compression format, the DEFLATE compression format, the LZ4 compression format, and/or the Zstandard (or Zstd) compression format. As used herein, the term "data frame" may refer to any type of structured data element. The use of the term "data frame" should not be considered limiting of the disclosure, as any type of structured data element may be representative of a data frame.

The frame descriptors 212a, 212b, may be part of the headers of the respective frames and may generally encode information describing the respective frames. For example, the frame descriptors 212a, 212b may encode information such as whether data blocks 214a, 214b are independent, whether checksums are included in the frames 202, 204, a window size of the frames 202, 204, a maximum size of each of the data blocks 214a, 214b, and the like.

As shown, a pointer 206 illustrates a location in data frame 202 where conventional accelerator devices would begin consuming the data frame 202. Stated differently, conventional accelerator devices would not consume the entirety of data frame 202. Instead, an application would decode the data frame 202 to identify the magic number 210a, the frame descriptor 212a, and any relevant parameters therein. The application would then provide decoded parameters from the magic number 210a and frame descriptor 212a to the accelerator device, which would configure itself based on such parameters, and begin decompressing the data blocks 214a.

However, having software decode the data frame 202 is slower than having circuitry decode the same, which may result in 10% or greater increases in latency. Furthermore, allowing software to configure the accelerator poses security risks, as malicious actors may access data in the accelerator or submit denial of service attacks to the accelerator.

Advantageously, however, the accelerator 154 is configured to consume data frames at location 208, which corresponds to the beginning, or header, of the data frame 204. Stated differently, accelerator 154 is configured to consume the entire data frame 204. Doing so may result in faster performance by reducing latency incurred by having software decode the magic number 210a and frame descriptor 212a.

The accelerator 154 may identify the magic number 210b in the data frame 204. The accelerator 154 may determine whether the compression format corresponding to the magic number 210b is supported by the accelerator 154. If the format is not supported, the accelerator 154 may return an error to the software that submitted the data frame 204 for decompression. In some embodiments, a compression format may not require magic numbers (e.g. the DEFLATE compression format, the Broth format, etc.) in data frames. In such embodiments, the software may include a predetermined magic number 210b to identify the compression format of the data frame 204. The accelerator 154 may then identify the compression format based on the predetermined magic number.

If the format is supported, the accelerator 154 may configure itself based on stored configuration parameters for the supported format. Generally, the configuration of the accelerator 154 is based on a well-defined configuration word (e.g., a 32-bit or 64-bit configuration word), where each bit represents a feature or configuration. For example, the accelerator 154 may determine the window size from the frame descriptor 212b and configure the accelerator 154 to decompress the data blocks 214b based on the compression format and the determined window size (e.g., by including indications of the compression format and window size in one or more bits of the configuration word). In some embodiments, the compression format does not specify the window size in the frame descriptor 212b. In such embodiments, the accelerator 154 may use a predetermined window size when the magic number corresponding to these compression formats is identified by the accelerator 154.

Figure 3:
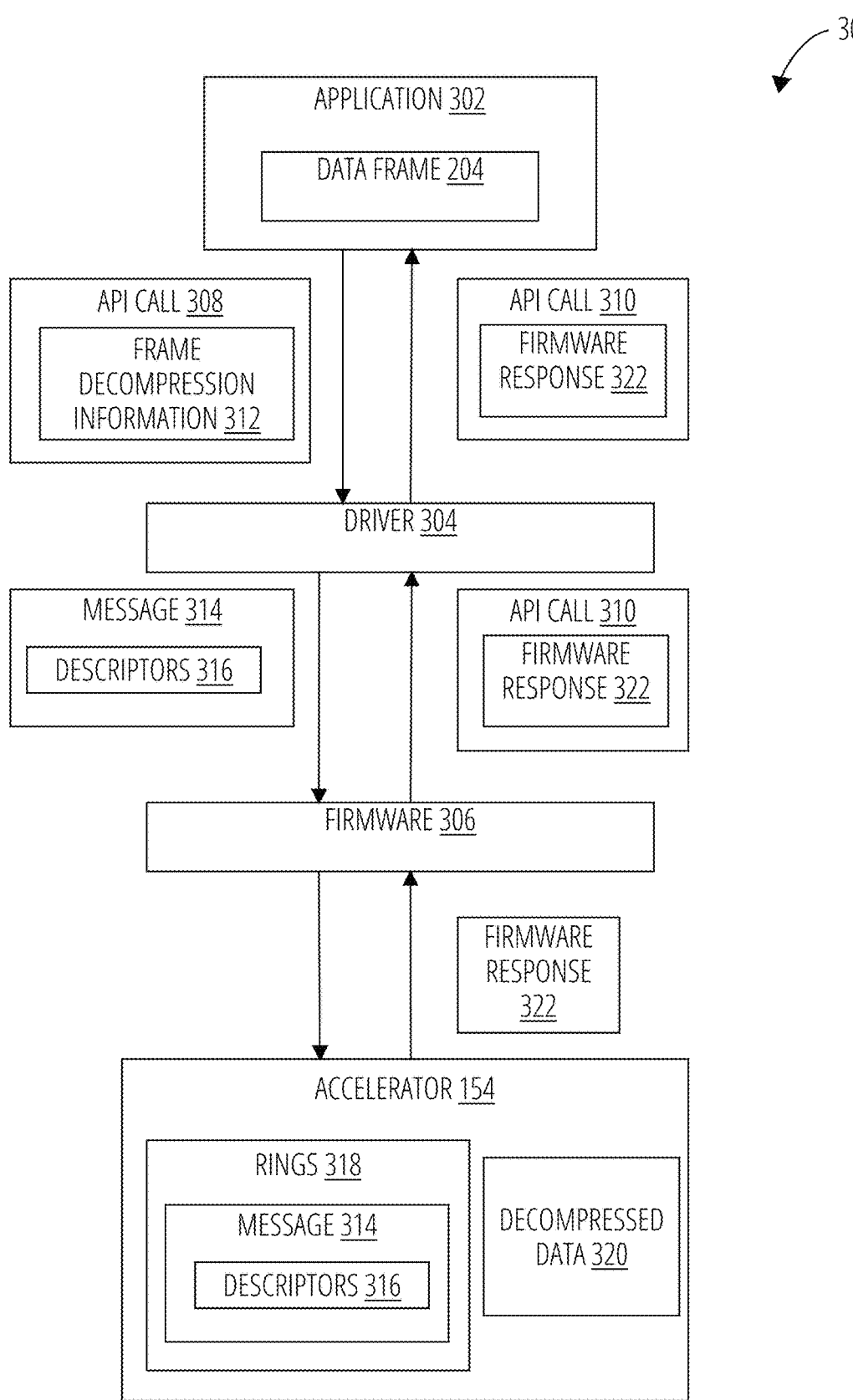
FIG. 3 illustrates an aspect of the subject matter in accordance with one embodiment.

FIG. 3 is a schematic 300 illustrating an example of adaptive decompression performed by accelerator devices, according to one embodiment. Generally, an application 302 may require decompression of compressed data, such the compressed data blocks 214b of the data frame 204 (e.g., a structured data element). The application 302 may be executing on one or more of the processors 104, 106. The application 302 is representative of any type of executable code. For example, the application 302 may be representative of a process or a microservice. Furthermore, the code may execute within a virtual machine, container, or other virtualized system, e.g., in a cloud computing data center. In such embodiments, multiple applications 302 and/or virtualized systems may share the accelerator 154, where the accelerator 154 is a virtual instance of the physical accelerator 154 (e.g., according to the Single Root I/O virtualization (SR-IOV) architecture and/or the Scalable I/O virtualization (S-IOV) architecture). Furthermore, the application 302 or other executable code may execute within an operating system (OS) (not pictured) that provides support for the accelerator 154. Examples of such operating systems include operating systems supporting the OpenSSL library, operating systems supporting the LibreSSL library, Oracle® Solaris OSes supporting the Solaris Cryptographic Framework (SCF), the FreeBSD® family of operating systems, the OpenBSD Cryptographic Framework (OCF), Linux® operating systems supporting the Crypto API, and Microsoft® Windows® OSes supporting the Microsoft CryptoAPI. Furthermore, the application 302 or other executable code may be a part of the Apache® Hadoop® framework, including the Hadoop Distributed File System (HDFS®), the Microsoft Azure® cloud computing framework, or any other cloud computing framework supporting compression and/or decompression acceleration technology.

The compressed data blocks 214b may be any type of compressed data and may be compressed according to any compression format (or algorithm). In some embodiments, data blocks 214b are associated with a compressed file system such as HDFS. Therefore, in such embodiments, the data blocks 214b may be part of a MapReduce operation which uses the HDFS and requires fast decompression. As another example, the data blocks 214b may be part of a storage solution that requires decompression, such as the Ceph File System. As another example, the data blocks 214b may be decompressed by Oracle Sparc systems. As another example, in some embodiments, the data blocks 214b may be part of a dataset used for training ML models or other artificial intelligence (AI) systems. In some embodiments, the data frame 204 may be communicated using a secure transport protocol (e.g., the Transport Layer Security (TLS) protocol). In some embodiments, the data frame 204 may be used as part of a trust as-a-service framework. As stated, the accelerator 154 is configured to decompress data much more efficiently and quickly than the processors 104, 106. Therefore, the application 302 may generally request that the accelerator 154 decompress the data blocks 214b.

As shown, the application 302 may generate an application programming interface (API) call 308 that may include frame decompression information 312 for the data frame 204. In some embodiments, the frame decompression information 312 is representative of a scatter gather buffer list that includes indications of the number of buffers in the list, a pointer to an unbounded array of memory (e.g., in memory 116 or memory 118) that contains one or more buffers (and correspondingly, the data frame 204), and a private representation of the buffer list. Embodiments are not limited in this context, as any suitable technique to identify the data frame 204 in memory for direct memory access (DMA) by the accelerator 154 may be used as the frame decompression information 312.

As shown, a device driver 304 of the accelerator 154 may receive the API call 308. The driver 304 may include a microservice (not pictured) configured to expose one or more APIs to receive the API call 308. Once received, the driver 304 may generate a message 314 that is sent to the firmware 306. The message 314 may be placed in one or more memory rings 318 of the accelerator 154 by the firmware 306 and/or the driver 304. As shown, the message 314 includes descriptors 316. The descriptors 316 may include the frame decompression information 312 and/or any attribute of the data frame 204. For example, the message 314 may include an indication of decompression, the decompression algorithm (e.g., based on the magic number 210b), a length of the data frame 204, a physical memory address of the data frame 204, one or more services being used, an address of an output buffer for the decompressed data 320, a size of the output buffer. In some embodiments, the message 314 is 128 bytes in length. In some embodiments, the firmware 306 includes a microservice configured to expose one or more APIs to receive the message 314.

The firmware 306 may then configure the accelerator 154 based on the message 314. In some embodiments, the firmware 306 may generate one or more hardware configuration words based on the message 314 and store the hardware configuration words as the message 314 on the rings 318. Generally, an array of hardware accelerators of the accelerator 154 may be configured based on the message 314, e.g., to optimally process the data blocks 214b according to the compression format identified by the magic number 210b. For example, by identifying the magic number 210b associated with the LZ4 format in the data frame 204, the firmware 306 may configure the accelerator 154 to decompress the data blocks 214b based on the LZ4 format. The accelerator 154 may then decompress the data blocks 214b to generate decompressed data 320 and store the decompressed data 320 in the location specified by the message 314 (e.g., in memory using DMA). The accelerator 154 may then return a firmware response 322 (e.g., a callback) that indicates the information necessary for the application 302 to access the decompressed data 320, including memory locations, a size of the decompressed data 320, a checksum of the data blocks 214b, and a checksum of the decompressed data 320. The firmware 306 may generate an API call 310 based on the firmware response 322, which may be returned to the driver 304. The driver 304 may then provide the API call 310 to the application 302, which may access the decompressed data 320 based on the result.

Figure 4:
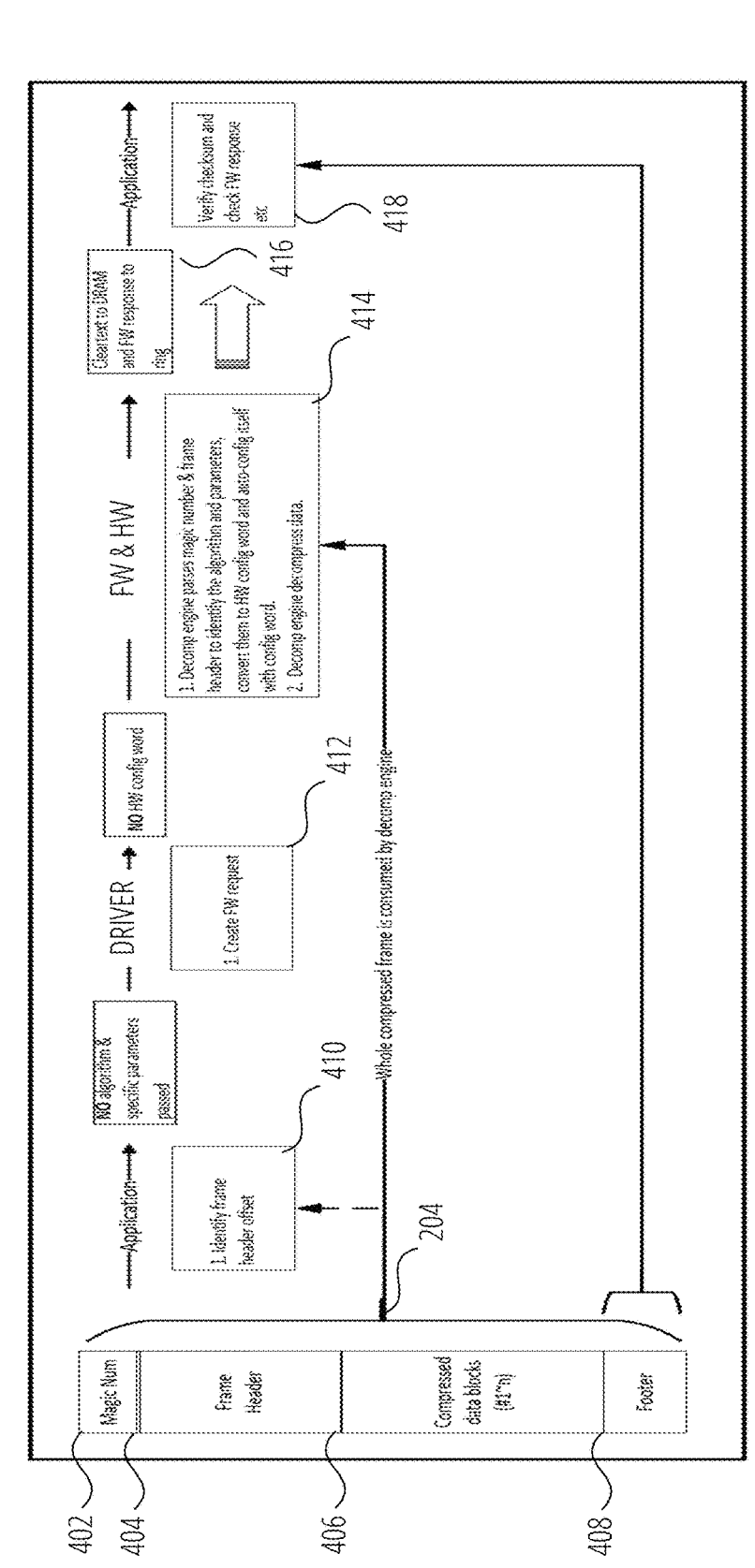
FIG. 4 illustrates an aspect of the subject matter in accordance with one embodiment.

FIG. 4 is a schematic 400 illustrating an example of adaptive decompression performed by accelerator devices, according to one embodiment. As shown, the data frame 204 received by the application 302 may include a magic number 402, a frame header 404, one or more compressed data blocks 406, and a footer 408. At block 410, the application 302 may specify an offset into the magic number 402 of the data frame 204. At block 412, the driver 304 of the accelerator 154 may create a firmware request based on the data frame 204 and the frame header offset. The firmware request may specify the applicable compression algorithm and associated parameters (e.g., an indication of decompression, the decompression algorithm (e.g., based on the magic number 402), a length of the data frame 204, a physical memory address of the data frame 204, one or more services being used, an address of an output buffer for the decompressed data, a size of the output buffer, etc.).

At block 414, the accelerator 154 parses the magic number 402 and frame header 404 to identify the applicable compression algorithm and associated parameters (e.g., the indication of decompression, the decompression algorithm (e.g., based on the magic number 402), the length of the data frame 204, the physical memory address of the data frame 204, the one or more services being used, the address of the output buffer for the decompressed data, the size of the output buffer, etc.) to the accelerator 154 hardware. The accelerator 154 may then generate one or more hardware configuration words to configure the accelerator 154. The accelerator 154 may then auto-configure itself based on the hardware configuration words. The accelerator 154 may then decompress the compressed data blocks 406 in the data frame 204. At block 416, the accelerator 154 stores the decompressed, cleartext data in memory (e.g., based on the address of the output buffer) and generates a firmware response 322 to the application 302. At block 418, the application 302 may verify checksums generated by the accelerator 154 and otherwise access the decompressed data.

Advantageously, as shown, the data is decompressed without the application providing any specific parameters to the accelerator 154. Furthermore, the driver 304 does not generate hardware configuration words for the accelerator 154. Instead, the accelerator 154 parses the magic number 402 and frame header 404 to generate the hardware configuration words, which allow the accelerator 154 to automatically configure itself to decompress according to the associated format. Advantageously, not allowing the application 302 and/or the driver 304 to create the hardware configuration words significantly reduces the risk of a malicious attack. Furthermore, the accelerator 154 may configure itself to decompress different types of compressed data in different data frames. For example, the accelerator 154 may configure itself to decompress a first data frame that includes compressed data according to a first format and configure itself to decompress a second data frame that includes compressed data according to a second format. Embodiments are not limited in this context.

Figure 5:
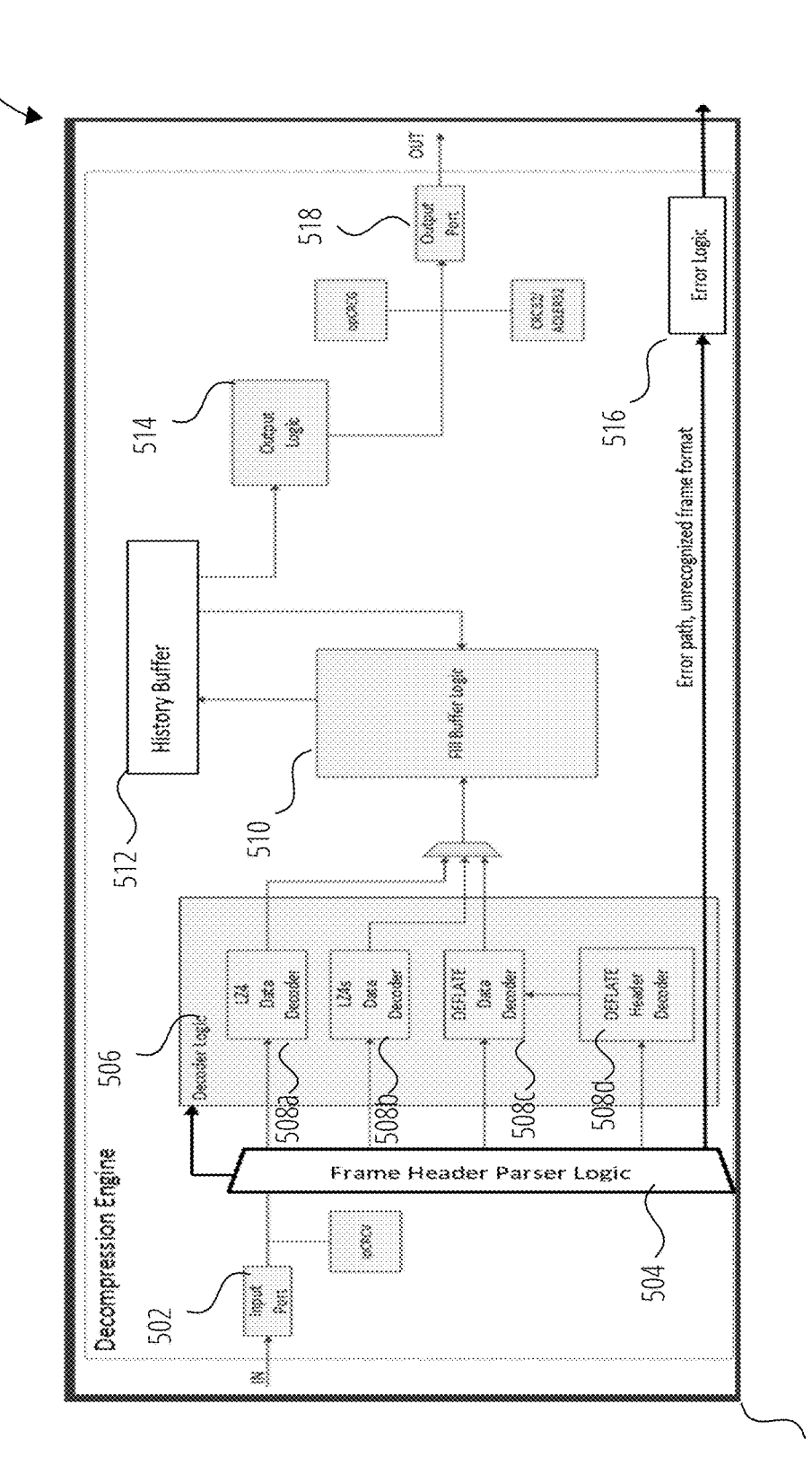
FIG. 5 illustrates an aspect of the subject matter in accordance with one embodiment.

FIG. 5 is a schematic 500 illustrating components of the accelerator 154 in greater detail, according to various embodiments. As shown, the accelerator 154 includes an input port 502, a frame header parser logic 504, a configuration unit 506, a fill buffer logic 510, a history buffer 512, an output logic 514, an error logic 516, and an output port 518, each of which may be implemented in hardware (e.g., circuitry).

The input port 502 of the accelerator 154 may be configured to receive a data frame, such as the data frame 204. The frame header parser logic 504 may identify the magic number of the data frame and output the data frame to one or more of the decoders 508a, 508b, 508c, 508d based on the compression format associated with the magic number of the data frame. For example, each decoder 508a-508d may include circuitry optimized to decompress data according to a predetermined compression format. Therefore, if the magic number of the frame indicates the frame is associated with the LZ4 format, the frame header parser logic 504 may output the frame to decoder 508a. If, however, the magic number indicates the frame is associated with an unsupported format, the frame header parser logic 504 may provide the frame to the error logic 516. The error logic 516 may then return an error to the application 302.

If the compression format is supported, the data blocks of the data frame may be decompressed by the decoders of the accelerator 154. The decompressed data may then be provided to the fill buffer logic 510. The fill buffer logic 510 may interface with the history buffer 512, which may provide the decompressed data to the output logic 514. The decompressed data (along with any checksums and/or cyclic redundancy checks (CRCs) of the data frame and the decompressed data) may be returned to the application 302 via the output port 518 and memory. For example, the decompressed data, checksums, and/or CRCs may be returned to a scatter gather list of the output buffer indicated in the message 314.

Operations for the disclosed embodiments may be further described with reference to the following figures. Some of the figures may include a logic flow. Although such figures presented herein may include a particular logic flow, it can be appreciated that the logic flow merely provides an example of how the general functionality as described herein can be implemented. Further, a given logic flow does not necessarily have to be executed in the order presented unless otherwise indicated. Moreover, not all acts illustrated in a logic flow may be required in some embodiments. In addition, the given logic flow may be implemented by a hardware element, a software element executed by a processor, or any combination thereof. The embodiments are not limited in this context.

FIG. 6 illustrates an embodiment of a logic flow 600. The logic flow 600 may be representative of some or all of the operations executed by one or more embodiments described herein. For example, the logic flow 600 may include some or all of the operations performed by the accelerator 154 to decompress data frames. Embodiments are not limited in this context.

In block 602, the driver 304 of the accelerator 154 may receive an API call, such as the API call 308, for decompression from an application 302. At block 604, the driver 304 may create a message descriptor based on the request. At block 606, the driver 304 places the message descriptor in a hardware queue for processing by the firmware 306.

FIG. 7 illustrates an embodiment of a logic flow 700. The logic flow 700 may be representative of some or all of the operations executed by one or more embodiments described herein. For example, the logic flow 700 may include some or all of the operations performed by the accelerator 154 to decompress data frames. Embodiments are not limited in this context.

In block 702, logic flow 700 the accelerator 154 determines a compression format based on a header of a structured data element (e.g., the data frame 202, data frame 204, etc.) to be decompressed. For example, the accelerator 154 may identify a magic number in the header. In block 704, the accelerator 154 determines whether the compression format is supported by the accelerator 154. In block 706, the error logic 516 of the accelerator 154 returns an error based on a determination the compression format is not supported by the accelerator 154. In block 708, the accelerator 154 configures itself based on the compression format and a determination that the compression format is supported by the accelerator device. In block 710, the accelerator 154 decompresses a data block of the structured data element based on the configuration.

FIG. 8 illustrates an embodiment of a storage medium 802. Storage medium 802 may comprise any non-transitory computer-readable storage medium or machine-readable storage medium, such as an optical, magnetic, or semiconductor storage medium. In various embodiments, storage medium 802 may comprise an article of manufacture. In some embodiments, storage medium 802 may store computer-executable instructions, such as computer-executable instructions to implement one or more of logic flows or operations described herein, such as computer executable instructions 804 for the driver 304 and instructions 806 for the firmware 306. Similarly, the storage medium 802 may include instructions 808 for logic flow 600 and instructions 810 for logic flow 700. The accelerator 154, processor 104, and/or processor 106 may execute any of the instructions in storage medium 802. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable type of code, such as source code, compiled code, interpreted code, executable code, static code, dynamic code, object-oriented code, visual code, and the like. The embodiments are not limited in this context.

The components and features of the devices described above may be implemented using any combination of discrete circuitry, application specific integrated circuits (ASICs), logic gates and/or single chip architectures. Further, the features of the devices may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It will be appreciated that the exemplary devices shown in the block diagrams described above may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

At least one computer-readable storage medium may include instructions that, when executed, cause a system to perform any of the computer-implemented methods described herein.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Moreover, unless otherwise noted the features described above are recognized to be usable together in any combination. Thus, any features discussed separately may be employed in combination with each other unless it is noted that the features are incompatible with each other.

With general reference to notations and nomenclature used herein, the detailed descriptions herein may be presented in terms of program procedures executed on a computer or network of computers. These procedural descriptions and representations are used by those skilled in the art to most effectively convey the substance of their work to others skilled in the art.

A procedure is here, and generally, conceived to be a self-consistent sequence of operations leading to a desired result. These operations are those requiring physical manipulations of physical quantities. Usually, though not necessarily, these quantities take the form of electrical, magnetic or optical signals capable of being stored, transferred, combined, compared, and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to those quantities.

Further, the manipulations performed are often referred to in terms, such as adding or comparing, which are commonly associated with mental operations performed by a human operator. No such capability of a human operator is necessary, or desirable in most cases, in any of the operations described herein, which form part of one or more embodiments. Rather, the operations are machine operations. Useful machines for performing operations of various embodiments include general purpose digital computers or similar devices.

Some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Various embodiments also relate to apparatus or systems for performing these operations. This apparatus may be specially constructed for the required purpose or it may comprise a general purpose computer as selectively activated or reconfigured by a computer program stored in the computer. The procedures presented herein are not inherently related to a particular computer or other apparatus. Various general purpose machines may be used with programs written in accordance with the teachings herein, or it may prove convenient to construct more specialized apparatus to perform the required method steps. The required structure for a variety of these machines will appear from the description given.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The various elements of the devices as previously described with reference to FIGS. 1-6 may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

It will be appreciated that the exemplary devices shown in the block diagrams described above may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

At least one computer-readable storage medium may include instructions that, when executed, cause a system to perform any of the computer-implemented methods described herein.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Moreover, unless otherwise noted the features described above are recognized to be usable together in any combination. Thus, any features discussed separately may be employed in combination with each other unless it is noted that the features are incompatible with each other.

The following examples pertain to further embodiments, from which numerous permutations and configurations will be apparent.

Example 1 includes an apparatus, comprising: a processor circuit; and an accelerator device, the accelerator device to comprise circuitry configured to: determine a compression format based on a header of a structured data element to be decompressed; configure the accelerator device based on the compression format; and decompress, based on the configuration of the accelerator device, a data block of the structured data element.

Example 2 includes the subject matter of example 1, wherein the compression format is determined based on an identifier of the compression format in the header.

Example 3 includes the subject matter of example 2, wherein the compression format is one of a plurality of compression formats, where the identifier is one of a plurality of identifiers, wherein respective ones of the identifiers are associated with respective ones of the compression formats.

Example 4 includes the subject matter of example 2, the accelerator device to comprise circuitry configured to: determine a size of the data block based on the identifier; and configure the accelerator device based on the size of the data block.

Example 5 includes the subject matter of example 2, the accelerator device to comprise circuitry configured to: determine an offset to a first byte of the data block based on the identifier; and identify the first byte of the data block based on the offset.

Example 6 includes the subject matter of example 2, the accelerator device to comprise circuitry configured to: determine a window size of the compression format based on the identifier; and configure the accelerator device based on the window size of the compression format.

Example 7 includes the subject matter of example 1, wherein the structured data element is to comprise a data frame, wherein the data frame is to be received from one of an application, a virtual machine, a process, or a microservice, wherein the frame is received without the one of the application, the virtual machine, or the microservice parsing the header.

Example 8 includes the subject matter of example 1, the accelerator device to comprise circuitry configured to: determine another compression format based on an identifier in a header of another data frame; determine, based on the identifier, that the accelerator device does not support the another compression format; and return an error to an application based on the determination that the accelerator device does not support the another compression format.

Example 9 includes the subject matter of example 1, wherein the data frame is to be received via one or more application programming interface (API) calls to a device driver of the accelerator device.

Example 10 includes the subject matter of example 9, wherein the device driver is to generate, based on the one or more API calls, a message comprising a length of the data block, an indication to decompress the data block, and a memory address of the structured data element.

Example 11 includes the subject matter of example 10, the accelerator device to comprise circuitry configured to access the message in a queue of the accelerator device.

Example 12 includes the subject matter of example 1, the accelerator device to comprise circuitry configured to: store the decompressed data block in memory.

Example 13 includes a method, comprising: determining, by an accelerator device, a compression format based on a header of a structured data element to be decompressed; configuring, by the accelerator device, the accelerator device based on the compression format; and decompressing, by the accelerator device based on the configuration, a data block of the structured data element.

Example 14 includes the subject matter of example 13, wherein the compression format is determined based on an identifier of the compression format in the header.

Example 15 includes the subject matter of example 14, wherein the compression format is one of a plurality of compression formats, where the identifier is one of a plurality of identifiers, wherein respective ones of the identifiers are associated with respective ones of the compression formats.

Example 16 includes the subject matter of example 14, further comprising: determining, by the accelerator device, a size of the data block based on the identifier; and configuring the accelerator device based on the size of the data block.

Example 17 includes the subject matter of example 14, further comprising: determining, by the accelerator device, an offset to a first byte of the data block based on the identifier; and identifying, by the accelerator device, the first byte of the data block based on the offset.

Example 18 includes the subject matter of example 14, further comprising: determining, by the accelerator device, a window size of the compression format based on the identifier; and configuring, by the accelerator device, the accelerator device based on the window size of the compression format.

Example 19 includes the subject matter of example 13, wherein the structured data element is to be received from one of an application, a virtual machine, a process, or a microservice, wherein the frame is received without the one of the application, the virtual machine, or the microservice parsing the header.

Example 20 includes the subject matter of example 13, further comprising: determining, by the accelerator device, another compression format based on an identifier in a header of another data frame; determining, by the accelerator device based on the identifier, that the accelerator device does not support the another compression format; and returning, by the accelerator device, an error to an application based on the determination that the accelerator device does not support the another compression format.

Example 21 includes the subject matter of example 13, wherein the structured data element is to be received via one or more application programming interface (API) calls to a device driver of the accelerator device.

Example 22 includes the subject matter of example 21, wherein the device driver is to generate, based on the one or more API calls, a message comprising a length of the data block, an indication to decompress the data block, and a memory address of the structured data element.

Example 23 includes the subject matter of example 22, further comprising accessing, by the accelerator device, the message in a queue of the accelerator device.

Example 24 includes the subject matter of example 13, further comprising storing, by the accelerator device, the decompressed data block in memory.

Example 25 includes an accelerator device, comprising: an interface to a processor; and circuitry configured to: determine a compression format based on a header of a structured data element to be decompressed; configure the accelerator device based on the compression format; and decompress, based on the configuration of the accelerator device, a data block of the structured data element.

Example 26 includes the subject matter of example 25, wherein the compression format is determined based on an identifier of the compression format in the header.

Example 27 includes the subject matter of example 26, wherein the compression format is one of a plurality of compression formats, where the identifier is one of a plurality of identifiers, wherein respective ones of the identifiers are associated with respective ones of the compression formats.

Example 28 includes the subject matter of example 26, the circuitry configured to: determine a size of the data block based on the identifier; and configure the accelerator device based on the size of the data block.

Example 29 includes the subject matter of example 26, the circuitry configured to: determine an offset to a first byte of the data block based on the identifier; and identify the first byte of the data block based on the offset.

Example 30 includes the subject matter of example 26, the circuitry configured to: determine a window size of the compression format based on the identifier; and configure the accelerator device based on the window size of the compression format.

Example 31 includes the subject matter of example 25, wherein the structured data element is to comprise a data frame, wherein the data frame is to be received from one of an application, a virtual machine, a process, or a microservice, wherein the frame is received without the one of the application, the virtual machine, or the microservice parsing the header.

Example 32 includes the subject matter of example 25, the circuitry configured to: determine another compression format based on an identifier in a header of another data frame; determine, based on the identifier, that the accelerator device does not support the another compression format; and return an error to an application based on the determination that the accelerator device does not support the another compression format.

Example 33 includes the subject matter of example 25, wherein the data frame is to be received via one or more application programming interface (API) calls to a device driver of the accelerator device.

Example 34 includes the subject matter of example 33, wherein the device driver is to generate, based on the one or more API calls, a message comprising a length of the data block, an indication to decompress the data block, and a memory address of the structured data element.

Example 35 includes the subject matter of example 34, the circuitry configured to access the message in a queue of the accelerator device.

Example 36 includes the subject matter of example 25, the circuitry configured to: store the decompressed data block in memory.

Example 37 includes a computing apparatus comprising: means for determining a compression format based on a header of a structured data element to be decompressed; means for configuring an accelerator device based on the compression format; and means for decompressing, by the accelerator device based on the configuration, a data block of the structured data element.

Example 38 includes the subject matter of example 37, wherein the compression format is determined based on an identifier of the compression format in the header.

Example 39 includes the subject matter of example 38, wherein the compression format is one of a plurality of compression formats, where the identifier is one of a plurality of identifiers, wherein respective ones of the identifiers are associated with respective ones of the compression formats.

Example 40 includes the subject matter of example 38, further comprising: means for determining a size of the data block based on the identifier; and means for configuring the accelerator device based on the size of the data block.

Example 41 includes the subject matter of example 38, further comprising: means for determining an offset to a first byte of the data block based on the identifier; and means for identifying the first byte of the data block based on the offset.

Example 42 includes the subject matter of example 38, further comprising: means for determining a window size of the compression format based on the identifier; and means for configuring the accelerator device based on the window size of the compression format.

Example 43 includes the subject matter of example 37, wherein the structured data element is to be received from one of an application, a virtual machine, a process, or a microservice, wherein the frame is received without the one of the application, the virtual machine, or the microservice parse the header.

Example 44 includes the subject matter of example 37, further comprising: means for determining another compression format based on an identifier in a header of another data frame; means for determining, based on the identifier, that the accelerator device does not support the another compression format; and means for returning an error to an application based on the determination that the accelerator device does not support the another compression format.

Example 45 includes the subject matter of example 37, wherein the data frame is to be received via one or more application program interface (API) calls to a device driver of the accelerator device.

Example 46 includes the subject matter of example 45, further comprising: means for generating, based on the one or more API calls, a message comprising a length of the data block, an indication to decompress the data block, and a memory address of the structured data element.

Example 47 includes the subject matter of example 46, further comprising: means for accessing the message in a queue of the accelerator device.

Example 48 includes the subject matter of example 37, further comprising: means for storing the decompressed data block in memory.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An apparatus, comprising:
a processor circuit; and
an accelerator device, the accelerator device to comprise circuitry configured to:
   determine a compression format based on a header of a structured data element to be decompressed, wherein the compression format is determined based on an identifier of the compression format in the header;
   determine a size of a data block of the structured data element based on the identifier;
   configure the accelerator device based on the the size of the data block; and
   decompress, based on the configuration of the accelerator device, the data block of the structured data element.

2. The apparatus of claim 1, wherein the compression format is one of a plurality of compression formats, where the identifier is one of a plurality of identifiers, wherein respective ones of the identifiers are associated with respective ones of the compression formats.

3. The apparatus of claim 1, the accelerator device to comprise circuitry configured to:
   determine an offset to a first byte of the data block based on the identifier; and
   identify the first byte of the data block based on the offset.

4. The apparatus of claim 1, the accelerator device to comprise circuitry configured to:
   determine a window size of the compression format based on the identifier; and
   configure the accelerator device based on the window size of the compression format.

5. The apparatus of claim 1, wherein the structured data element is to comprise a data frame, wherein the data frame is to be received from one of an application, a virtual machine, a process, or a microservice, wherein the frame is received without the one of the application, the virtual machine, or the microservice parsing the header.

6. The apparatus of claim 1, the accelerator device to comprise circuitry configured to:
   determine another compression format based on an identifier in a header of another data frame;
   determine, based on the identifier, that the accelerator device does not support the another compression format; and
   return an error to an application based on the determination that the accelerator device does not support the another compression format.

7. The apparatus of claim 1, wherein the structured data element is to be received via one or more application programming interface (API) calls to a device driver of the accelerator device.

8. The apparatus of claim 7, wherein the device driver is to generate, based on the one or more API calls, a message comprising a length of the data block, an indication to decompress the data block, and a memory address of the structured data element.

9. The apparatus of claim 8, the accelerator device to comprise circuitry configured to access the message in a queue of the accelerator device.

10. The apparatus of claim 1, the accelerator device to comprise circuitry configured to:

store the decompressed data block in memory.

11. A method, comprising:

determining, by an accelerator device, a compression format based on a header of a structured data element to be decompressed, wherein the compression format is determined based on an identifier of the compression format in the header;

determining, by the accelerator device, an offset to a first byte of a data block of the structured data element based on the identifier;

configuring, by the accelerator device, the accelerator device based on the compression format;

identifying, by the accelerator device, the first byte of the data block based on the offset; and decompressing, by the accelerator device based on the configuration, the data block of the structured data element.

12. The method of claim 11, further comprising:

determining, by the accelerator device, another compression format based on an identifier in a header of another data frame;

determining, by the accelerator device based on the identifier, that the accelerator device does not support the another compression format; and returning, by the accelerator device, an error to an application based on the determination that the accelerator device does not support the another compression format.

13. The method of claim 11, wherein the compression format is one of a plurality of compression formats, where the identifier is one of a plurality of identifiers, wherein respective ones of the identifiers are associated with respective ones of the compression formats.

14. The method of claim 11, further comprising:

determining, by the accelerator device, a size of the data block based on the identifier; and configuring the accelerator based on the size of the data block.

15. The method of claim 11, further comprising storing, by the accelerator device, the decompressed data block in memory.

16. The method of claim 11, further comprising:

determining, by the accelerator device, a window size of the compression format based on the identifier; and configuring, by the accelerator device, the accelerator device based on the window size of the compression format.

17. The method of claim 11, wherein the structured data element is to comprise a data frame, wherein the data frame is to be received from one of an application, a virtual machine, a process, or a microservice, wherein the frame is received without the one of the application, the virtual machine, or the microservice parsing the header.

18. The method of claim 11, further comprising receiving, by the accelerator device, the structured data element via one or more application programming interface (API) calls to a device driver of the accelerator device.

19. An accelerator device, comprising:

an interface to a processor; and circuitry configured to:

determine a compression format based on a header of a structured data element to be decompressed, wherein the compression format is determined based on an identifier of the compression format in the header;

determine a window size of the compression format based on the identifier;

configure the accelerator device based on the window size of the compression format; and decompress, based on the configuration of the accelerator device, a data block of the structured data element.

20. The accelerator device of claim 19, the circuitry configured to store the decompressed data block in memory.

21. The accelerator device of claim 19, wherein the compression format is one of a plurality of compression formats, where the identifier is one of a plurality of identifiers, wherein respective ones of the identifiers are associated with respective ones of the compression formats.

22. The accelerator device of claim 19, the circuitry configured to:

determine a size of the data block based on the identifier; and configure the accelerator device based on the size of the data block.

23. The accelerator device of claim 19, the circuitry configured to:

determine an offset to a first byte of the data block based on the identifier; and identify the first byte of the data block based on the offset.

24. The accelerator device of claim 19, the circuitry configured to:

determine another compression format based on an identifier in a header of another data frame;

determine, based on the identifier, that the accelerator device does not support the another compression format; and return an error to an application based on the determination that the accelerator device does not support the another compression format.

25. The accelerator device of claim 19, wherein the structured data element is to be received via one or more application programming interface (API) calls to a device driver of the accelerator device.

* * * * *